United States Patent [19]

Fukushima

[11] Patent Number: 5,506,806
[45] Date of Patent: Apr. 9, 1996

[54] MEMORY PROTECTION CIRCUIT FOR EPROM

[75] Inventor: Kiyoshi Fukushima, Tokyo, Japan

[73] Assignee: NEC Corporation, Tokyo, Japan

[21] Appl. No.: 309,028

[22] Filed: Sep. 20, 1994

[30]   Foreign Application Priority Data

Sep. 20, 1993 [JP] Japan .................................. 5-255298

[51] Int. Cl.⁶ ..................................................... G11C 7/00
[52] U.S. Cl. ...................... 365/195; 365/185.04; 365/196
[58] Field of Search ......................... 365/189.01, 185.01, 365/195, 196, 185.04, 185.06

[56]   References Cited

U.S. PATENT DOCUMENTS

| | | | |
|---|---|---|---|
| 4,791,612 | 12/1988 | Yoshida | 365/195 X |
| 5,337,281 | 8/1994 | Kobayashi | 365/185 X |
| 5,381,369 | 1/1995 | Kikuchi | 365/189.01 |

FOREIGN PATENT DOCUMENTS

| | | | |
|---|---|---|---|
| 60-57597 | 4/1985 | Japan | 365/195 |
| 61-57099 | 3/1986 | Japan | 365/195 |
| 61-28144 | 6/1986 | Japan . | |

*Primary Examiner*—David C. Nelms
*Assistant Examiner*—Son Mai
*Attorney, Agent, or Firm*—Whitham, Curtis, Whitham & McGinn

[57]   ABSTRACT

An erasable programmable read-only memory (EPROM) includes a plurality of EPROM cells arranged in a matrix having a plurality of rows and a plurality of columns, and a plurality of digit lines each connected in common to drains of the EPROM cells included in a corresponding one column of EPROM cells. A Y-selector receives a Y-address of a given address for selecting one digit line of the digit lines so as to connect the selected digit line to a sense amplifier. Each of the digit lines is connected to one of reading-inhibition circuits having a reading-inhibition information storing EPROM cell, so that when the reading-inhibition information storing EPROM cell of the reading-inhibition circuits are in a written condition, the digit line is forcibly maintained at a predetermined logic level. The EPROM can inhibit the reading of any bit or bits and any area of an EPROM.

20 Claims, 4 Drawing Sheets

MEMORY PROTECTION CIRCUIT FOR EPROM

BACKGROUND OF THE INVENTION

1. Field of the Invention

The present invention relates to a semiconductor memory device, and more specifically, to an EPROM (Erasable Programmable ROM (Read Only Memory)) formed within a single chip microcomputer and associated with a read-inhibiting circuit for protecting a content of the EPROM.

2. Description of Related Art

An EPROM is widely used for development and evaluation of a program to be written in a masked ROM which is mainly used in articles manufactured on a mass production basis, and also for an initial mass production stage of articles. Therefore, the EPROM is written with information, such as know-how of a program, which should be kept secret from outsiders. However, since a content of the EPROM can easily be read by a PROM writer, it has become necessary to provide a memory protection circuit for the EPROM for the purpose of protecting the information written in the EPROM.

Japanese Patent Post-examination Publication No. Showa 61-28144 proposed a conventional example of the memory protection circuit for the EPROM. The memory protection circuit disclosed in this Japanese patent publication is shown in FIG. 1.

As shown in FIG. 1, this EPROM memory protection circuit is provided for an erasable ROM (EPROM) 301 including a number of memory cells which are of the FAMOS (floating gate avalanche injection MOS (metal-oxide-semiconductor)) structure and which are arranged in the form of a matrix. A plurality of output signal lines 302 extend from the EPROM 301.

The EPROM memory protection circuit includes a read-inhibiting flag 303 composed of an EPROM cell of the FAMOS structure which is provided separately from the EPROM 301 and which is written through a writing line 304, and a read-inhibiting circuit composed of a two-input AND gates 306 of the number corresponding to the number of the output signal lines 302 extending from the EPROM 301. Each of the two-input AND gates 306 has its one input connected to a corresponding one of the output signal lines 302 of the EPROM 301 and its other input connected in common to an output signal line 305 of the read-inhibiting flag 303. A port 307 is connected to respective output signal lines of the two-input AND gates 306.

Now, operation of the EPROM memory protection circuit shown in FIG. 1 will be explained.

1. In the case where the reading of the EPROM 301 is inhibited.

In order to inhibit the reading of the EPROM 301, the read-inhibiting flag 303 is preliminarily written through the writing line 304, so that the value of the output signal line 305 of the read-inhibiting flag 303 is brought to a logical low level signal "L". The outputs of the EPROM 301 are applied to the read-inhibiting AND gates 306 through the signal lines 302. Here, since the value of the signal line 305, which is supplied to the one input of each of the two-input AND gates 306 (constituting the read-inhibiting circuit), is at the logical low level "L", the output of all the two-input AND gates 306 are fixed to the logical low level "L", and therefore, the wading of the EPROM 301 from an external is inhibited.

2. In the case where the reading of the EPROM 301 is permitted.

In order to permit the reading of the EPROM 301, the read-inhibiting flag 303 is kept at an initial value, so that the value of the output signal line 305 of the read-inhibiting flag 303 is brought to a logical high level "H". The outputs of the EPROM 301 are applied through the signal lines 302 to the read-inhibiting AND gates 306. Since the value of the signal line 305, which is supplied to the one input of the two-input AND gates 306 (constituting the read-inhibiting circuit), is at the logical high level "H", the output of each two-input AND gate is made identical to a corresponding output of the EPROM 301, and send out to the external through the port 307. In this way, the output of the EPROM 301 is permitted.

Accordingly, after the reading of the EPROM 301 has been inhibited by the EPROM memory protection circuit, the reading of the content of the EPROM 301 needs erasure of the read-inhibiting flag 303. If ultraviolet ray are irradiated so as to erase the read-inhibiting flag 303 composed of the EPROM cell, the data stored in the EPROM 301 will also be inevitably erased simultaneously. Namely, when the EPROM 301 is put in a condition allowing its reading as the result of erasure of the read-inhibiting flag 303, the data to be read has already been erased. Accordingly, there is finally no concern that the data might be read from the external.

However, the above mentioned conventional EPROM memory protection circuit has the following problems.

1. Essentially, it is often the case that a user tries to confirm the content of a specific area of the EPROM even after the reading has been inhibited. For example, the reading of a program written in the EPROM should be inhibited, while data written in the EPROM should be able to be read out.

In the above mentioned conventional example of the EPROM memory protection circuit, however, the reading from the external is inhibited for the whole area corresponding to all bits of the EPROM. Therefore, it is impossible to partially inhibit the reading. For this reason, there is a serious problem that the reading is inhibited even in the area from which the reading inhibition is not desired by the user.

2. In the above mentioned conventional EPROM memory protection circuit, a third person who attempts to mad the program is inhibited from reading the content of the EPROM from an external by using an EPROM writer or the like. Therefore, when the information of the EPROM is read from the external, since there is a sharp distinction between the reading inhibition and the reading permission in the conventional method, it is a problem that it can be immediately known that the EPROM is in a read-inhibiting condition.

3. In addition, since the read-inhibiting flag 303 is provided separately from the EPROM 301, both a circuit structure and a mask design of a chip become complicated. Furthermore, since the read-inhibiting circuit composed of the AND gates 306 is provided near the output port, and since the control signals 305 are wired or extended to the proximity of the output port, it is a problem that the wiring area on a chip increases.

SUMMARY OF THE INVENTION

Accordingly, it is an object of the present invention to provide a memory protection circuit which has overcome the above mentioned defects of the conventional one.

Another object of the present invention is to provide a memory protection circuit for the EPROM, having a simple circuit structure and capable of inhibiting the reading of any bits and/or any areas of the EPROM.

The above and other objects of the present invention are achieved in accordance with the present invention by an EPROM having therein a memory protection circuit, the EPROM including a number of EPROM cells arranged in the form of a matrix having a plurality of rows and a plurality of columns, a plurality of digit lines each connected in common to drains of the EPROM cells included in a corresponding one column of EPROM cells, an X selector receiving an X address of an address given from an external and for selecting one row of EPROM cells from the plurality of rows of EPROM cells, a Y selector receiving a Y address of the address given from the external and for selecting one digit line of the digit lines, a sense amplifier receiving an output of the Y selector for discriminating a potential on the output of the Y selector so as to output a read-out bit signal, and a plurality of reading-inhibition circuits each connected to a corresponding digit line of the digit lines and each having a reading-inhibition information storing EPROM cell, so that when the reading-inhibition information storing EPROM cell of a selected reading-inhibition circuit the reading-inhibition circuits is in a written condition, the digit lines is forcibly maintained at a predetermined logic level.

In a preferred embodiment, the EPROM cells of the EPROM and the reading-inhibition information storing EPROM cells are of a FAMOS structure. In addition, when the reading-inhibition information storing EPROM cells are in a written condition, the digit lines are forcibly fixed either to a logical low level "L" level or to a logical high level "H".

In one embodiment, each of the read-inhibiting circuits includes the above mentioned reading-inhibition information storing EPROM cell having a gate connected to receive a read-inhibiting control signal, and a source connected to ground so that the reading-inhibition information storing EPROM cell is written when the read-inhibiting control signal is at a high voltage, a resistor having its one end connected to a high voltage supply voltage and its other end connected to a drain of the reading-inhibition information storing EPROM cell, a first N-channel MOS transistor having a grounded source and a gate connected to the drain of the reading-inhibition information storing EPROM cell, and a second N-channel MOS transistor having a source connected to a drain of the first N-channel MOS transistor and a gate connected to receive a control signal activated in a PROM mode, a drain of the second N-channel MOS transistor being connected to the corresponding digit line.

In another embodiment, each of the read-inhibiting circuits includes the above mentioned reading-inhibition information storing EPROM cell having a gate connected to receive a read-inhibiting control signal and a source connected to a high voltage supply voltage so that the reading-inhibition information storing EPROM cell is written when the read-inhibiting control signal is at a high voltage, a resistor having its one end connected to ground and its other end connected to a drain of the EPROM cell, a first P-channel MOS transistor having a source connected to the high voltage supply voltage and a gate connected to the drain of the reading-inhibition information storing EPROM cell, and a second P-channel MOS transistor having a source connected to a drain of the first P-channel MOS transistor and a gate input connected to receive a control signal brought to a logical low level "L" in a PROM mode, a drain of second P-channel MOS transistor being connected to the corresponding digit line.

The above and other objects, features and advantages of the present invention will be apparent from the following description of preferred embodiments of the invention with reference to the accompanying drawings.

DESCRIPTION OF THE PREFERRED EMBODIMENTS

Now, embodiments of the present invention will be described in detail with reference to the drawings.

Figure 1:
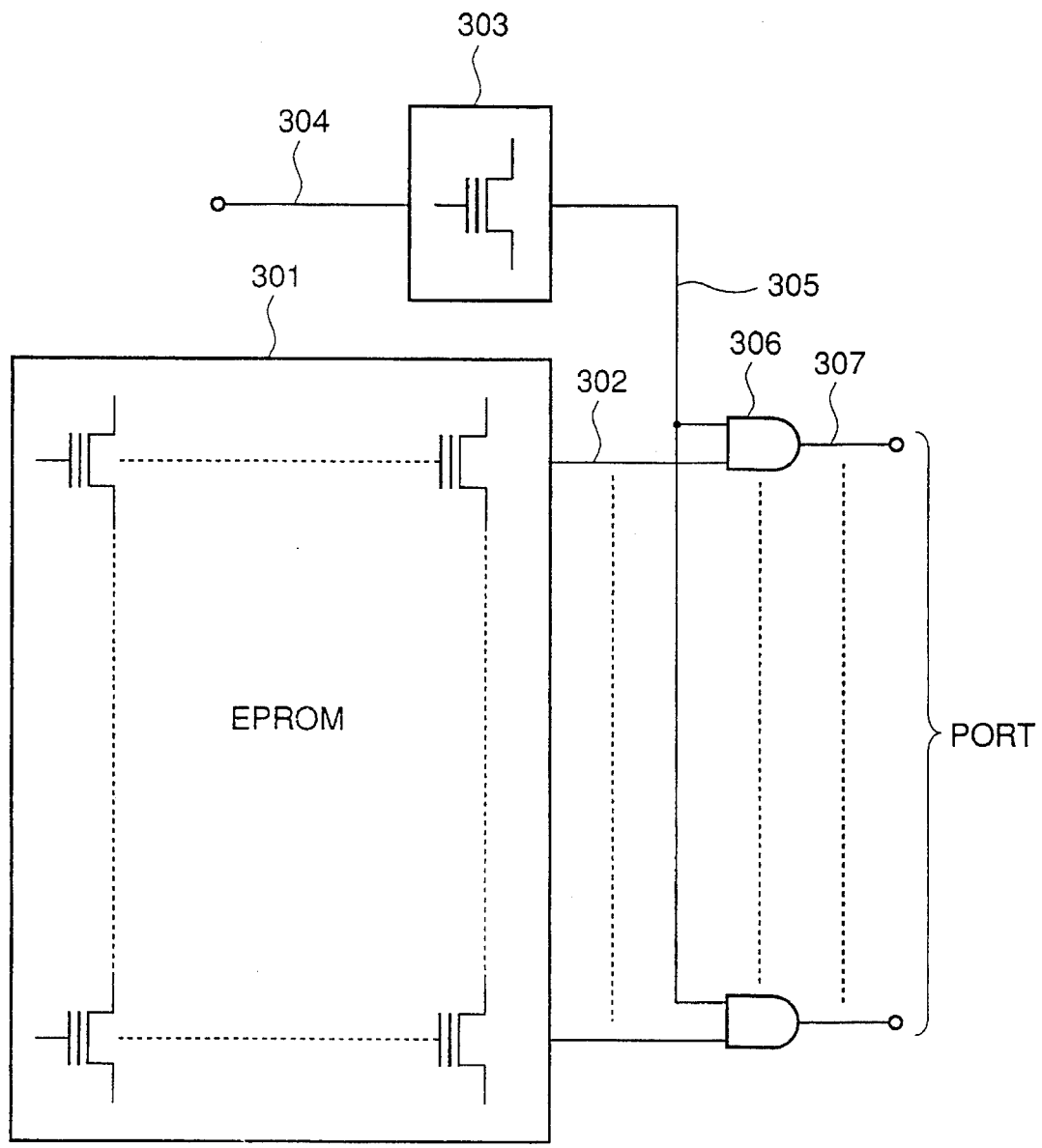
FIG. 1 is a circuit diagram illustrating one example of the conventional EPROM memory protection circuit.
Figure 2:
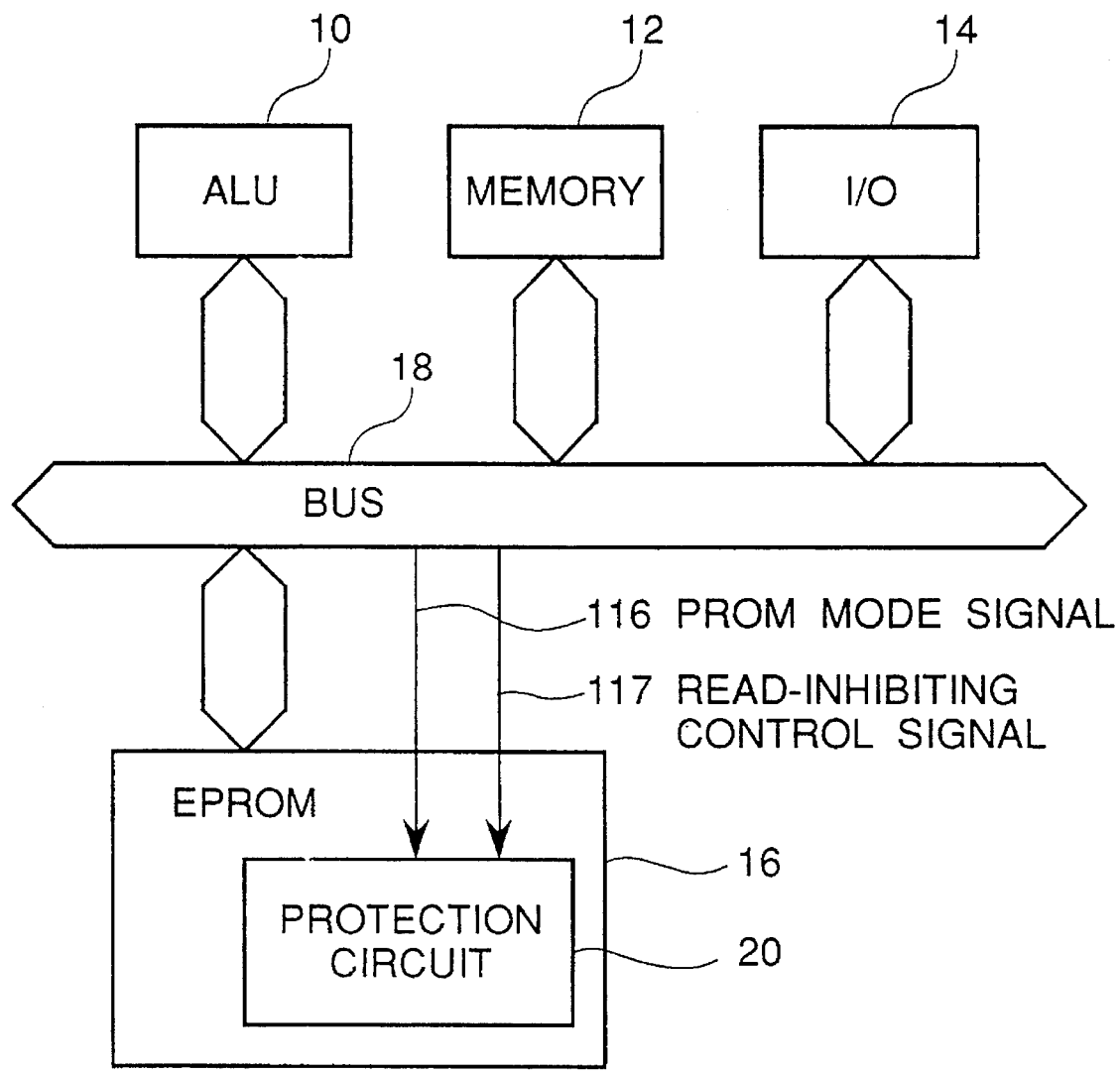
FIG. 2 is a block diagram illustrating a diagrammatic construction of a single chip microcomputer including the EPROM memory protection circuit in accordance with the present invention.

Referring to FIG. 2, them is shown a block diagram illustrating a diagrammatic construction of a single chip microcomputer including the EPROM memory protection circuit in accordance with the present invention.

The shown single chip microcomputer includes an ALU (arithmetic logic unit) 10, a memory 12, an input/output device 14 and an EPROM 16, which are connected to a bus 18, so that an address, data and various control signals are transferred through the bus 18 from one to another. This is a basic construction of the microcomputer well known to persons skilled in the art, and therefore, a further explanation will be omitted.

The EPROM 16 includes therein an EPROM memory protection circuit 20 in accordance with the present invention, which is controlled by a PROM mode signal 116 and a read-inhibiting control signal 117 (117B, . . . ), which are supplied from the ALU 10 through the bus 18 and will be explained in detail hereinafter.

EMBODIMENT 1

Figure 3:
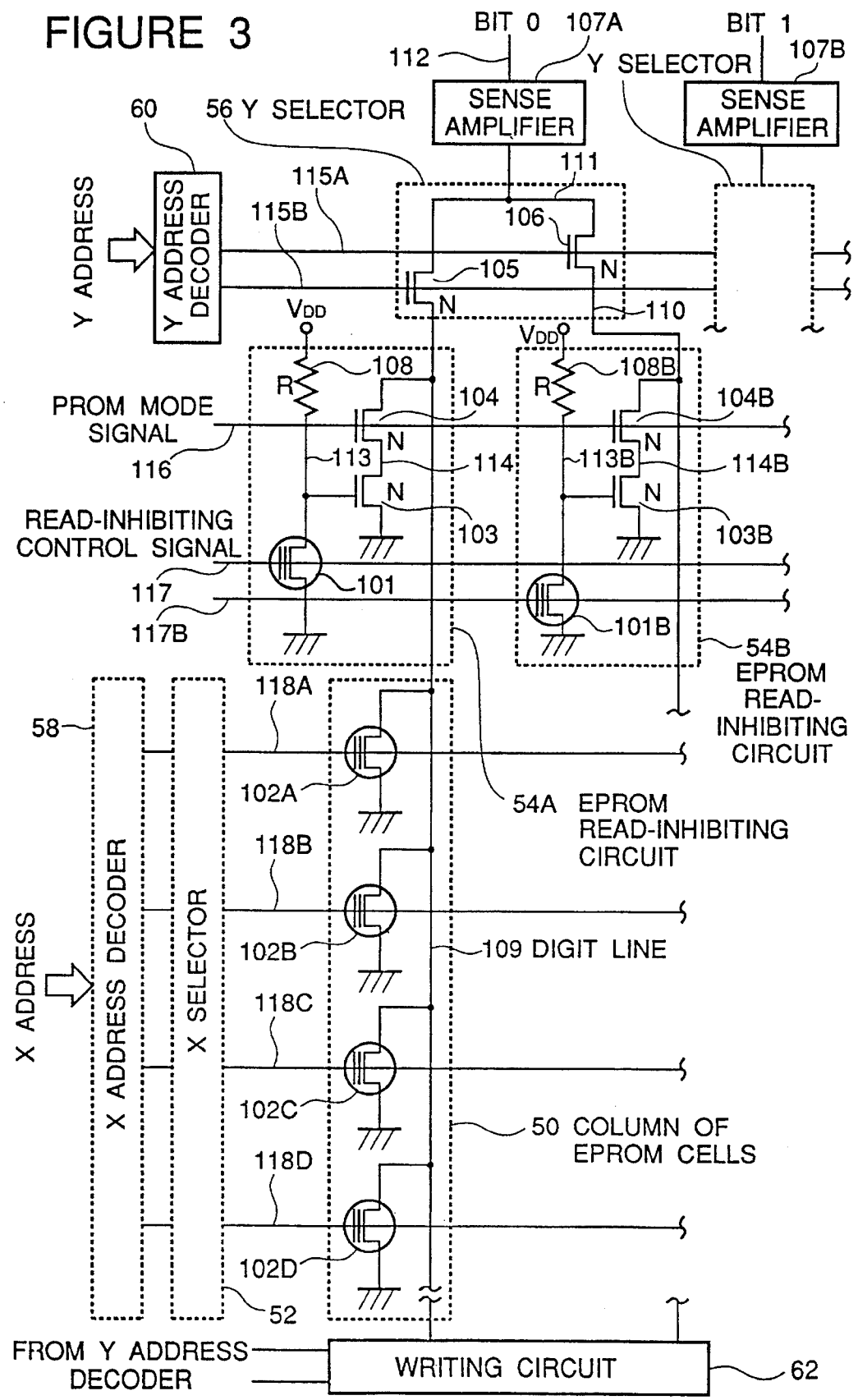
FIG. 3 is a circuit diagram illustrating a first embodiment of the EPROM memory protection circuit in accordance with the present invention.

Referring to FIG. 3, there is shown a circuit structure of an EPROM including therein the memory protection circuit in accordance with the first embodiment of the present invention. For simplification of the drawing and the explanation, FIG. 3 shows only a circuit structure regarding to one column 50 of EPROM cells in an EPROM which consists of a number of EPROM cells, and therefore, a circuit structure for the other EPROM cells is omitted for simplification of explanation.

The EPROM includes a number of EPROM cells of the FAMOS structure, arranged in the form of a matrix having a plurality of rows and a plurality of columns. One column 50 includes a plurality of EPROM cells 102A, 102B, 102C, 102D, . . . having their source connected to ground and their drain connected in common to one digit line 109. Gates of EPROM cells 102A, 102B, 102C, 102D, . . . are connected to word lines 118A, 118B, 118C, 118D, . . . , respectively, which are selectively activated by an X selector 52 controlled by an X address decoder 58 receiving an X address of a given address. Therefore, the word lines 118A, 118B, 118C, 118D, . . . are respectively connected to gates of EPROM cells (not shown) included in each column of the columns of EPROM cells (not shown).

The digit line 109 is connected to one input of a Y selector 56, which has an output connected to a sense amplifier 107A, which outputs a read-out signal for a bit "BIT 0". For the other bits of one word, there are provided a sense amplifier 107B for a bit "BIT 1" and a plurality of not-shown sense amplifiers for "BIT 2" to "BIT 7" if one word is constituted of 8 bits, or for "BIT 2" to "BIT 31" if one word is constituted of 32 bits. In addition, to the digit line 109, an EPROM read-inhibiting circuit 54A is connected.

At the beginning, the EPROM read-inhibiting circuit 54A will be explained in the following.

The EPROM read-inhibiting circuit 54A receives a read-inhibiting control signal 117 which is brought to a logical high level "H" when it is operated as EPROM (called a "PROM mode" hereinafter). The EPROM read-inhibiting circuit 54A includes an EPROM cell 101 of the FAMOS structure, having a source connected to ground, and a gate connected to receive the read-inhibiting control signal 117. A drain 113 of the EPROM cell 101 is connected to a high voltage supply voltage $V_{DD}$ through a resistor 108 as well as to a gate of an N-channel MOS transistor 103. When the read-inhibiting control signal 117 is at a predetermined high voltage level, the EPROM cell 101 is written.

A source of the N-channel MOS transistor 103 is grounded, and a drain 114 of the N-channel MOS transistor 103 is connected to a source of another N-channel MOS transistor 104. A gate of the N-channel MOS transistor 104 is connected to receive a PROM mode signal 116 which is activated to a logical high level in the PROM mode. A drain of the N-channel MOS transistor 104 is connected to a digit line 109.

The Y selector 56 has a plurality of inputs connected to a corresponding number of digit lines, respectively, and selects one digit line from the plurality of digit lines in accordance with the address given from the external. As shown in the figure, the Y selector 56 includes an N-channel MOS transistor 105 having a source connected to the digit line 109 (connected to the drain of the N-channel MOS transistor 104 of the EPROM read-inhibiting circuit) and a gate connected to a Y selector signal line 115A, and another N-channel MOS transistor 106 having a source connected to another digit line 110 (for another column of EPROM cells (not shown)) and a gate connected to another Y selector signal line 115B. The Y selector signal line 115A and 115B are selectively activated by a Y address decoder 60 receiving a Y address of the given address. Incidentally, similarly to the digit line 109, the digit line 110 is connected to an EPROM read-inhibiting circuit 54B, which is constructed similarly to the EPROM read-inhibiting circuit 54A, except that gate of a EPROM cell 101B, corresponding to the EPROM cell 101 in the EPROM read-inhibiting circuit 54A, is connected to receive another read-inhibiting control signal 117B. In the shown embodiment, therefore, the EPROM read-inhibiting circuit 54A, . . . connected to one input of each Y selector 56, . . . is controlled by the read-inhibiting control signal 117, and the EPROM read-inhibiting circuit 54B, . . . connected to the other input of each Y selector 56, . . . is controlled by the read-inhibiting control signal 117B. On the other hand, all of the EPROM read-inhibiting circuits including the EPROM read-inhibiting circuits 54A and 54B are controlled by the same PROM mode signal 116.

The sense amplifier 107A has an input connected to commonly connected drains 111 of the N-channel MOS transistor 105 and the N-channel MOS transistor 106, and operates to discriminate the voltage level of the commonly connected drains 111 in order to output an output signal 112 for the bit "BIT 0".

In addition, the digit lines 109 and 110 and the not-shown other digit lines are connected to a writing circuit 62, which is controlled by an output of the Y address decoder so as to supply a writing voltage to a selected digit line when the EPROM is written.

Here, when a user uses a single chip microcomputer internally containing the EPROM, it is necessary to write the internal EPROM, and to cheek the written content of the EPROM. Therefore, when the internal EPROM is accessed by using a PROM writer, it is set in a condition that the EPROM can be accessed just as a PROM. This set condition is called as the "PROM mode".

Next, operation of the EPROM memory protection circuit of the first embodiment shown in FIG. 3 will be explained in connection to the EPROM read-inhibiting circuit 54A and other circuits connected thereto.

1. In the case where the reading of the EPROM is inhibited in the PROM mode.

The EPROM cell 101 is previously written by setting the read-inhibiting control signal 117 to the predetermined high voltage for writing. When the writing is done by injecting an electric charge into a floating gate of the EPROM cell 101 of the FAMOS structure, a threshold voltage Vth of the EPROM cell 101 rises up, with the result that the EPROM cell 101 is maintained in an OFF state even if the read-inhibiting control signal 117 is brought to a logical high level "H".

For this reason, the voltage level of the drain 113 of the EPROM cell 101 is pulled up to the voltage supply voltage $V_{DD}$ though the resistor 108, namely, brought to a logical high level "H".

Because the gate input of the N-channel MOS transistor 103 is brought to the logical high level "H", the N-channel MOS transistor 103 turns ON, and therefore, the voltage of the drain 114 of the N-channel MOS transistor 103 is brought to the logical low level "L".

In the PROM mode, the PROM mode signal 116 is brought to the logical high level "H". Therefore, since the gate input of the N-channel MOS transistor 104 is brought to the logical high level "H", the N-channel MOS transistor 104 turns ON. Therefore, the voltage level of the drain of the N-channel MOS transistor 104 is brought to the ground level which is the same as the source of the N-channel MOS transistor 104.

Accordingly, the voltage of the digit line 109, (to which the drain of the N-channel MOS transistor 104 is connected) is fixed to the logical low level "L". In other words, the voltage level of the digit line 109 is fixed to the logical low level "L" regardless of whether the drain voltage of the EPROM cell (102A, 102B, 102C, 102D, . . . ,) selected by the X selector 52 is at the logical low level "L" or in a high impedance condition.

2. In the case where the reading of EPROM is permitted in the PROM mode.

In this case, the writing to the EPROM cell 101 is not conducted. In the case where the writing made by applying a high voltage to the gate of the EPROM cell 101 is not carried out, if the read-inhibiting control signal 117 is brought to the logical high level "H", the EPROM cell turns ON.

For this reason, the level of the drain 113 of the EPROM cell 101 is pulled down to the ground level, namely to the logical low level "L". Therefore, since the gate input of the N-channel MOS transistor 103 is brought to the logical low level "L", the N-channel MOS transistor 103 turns OFF. Accordingly, the drain 114 of the N-channel MOS transistor 103 is brought into the high impedance condition, with the result that the drain of the N-channel MOS transistor 104 is maintained into the high impedance condition even if the N-channel MOS transistor 104 is turned ON.

Therefore, the voltage level of the drain of the EPROM cell (102A, 102B, 102C, 102D, . . . ) selected by the X selector 52 becomes a voltage level of the digit line 109. This voltage level of the digit line 109 is applied to the sense amplifier 107A as it is, through the Y selector 56. Then, after the voltage level is discriminated by the sense amplifier 107A, it is delivered as the output signal 112 of the sense amplifier 107A 3. In the case where the EPROM is read out in a normal operation.

A brief explanation is now given on the case where the EPROM memory protection circuit in accordance with the present invention is operated in a normal operation, namely in a mode other than the PROM mode.

In the case other than the PROM mode, since the PROM mode signal 116 is brought to the logical low level "L", the gate of the N-channel MOS transistor 104 is brought to the logical low level "L", and therefore, the N-channel MOS transistor 104 turns OFF.

Accordingly, the drain of the N-channel MOS transistor 104 connected to the digit line 109 is brought into the high impedance condition. Thus, in exactly the same manner as that explained in the above Item "2. In the case where the reading of EPROM is permitted in the PROM mode", the voltage level of the drain of the EPROM cell (102A, 102B, 102C, 102D, . . . ) selected by the X selector 52 is applied to the sense amplifier 107A as it is, through the Y selector 56, and after the voltage level level is discriminated, it is outputted as the output signal 112.

As will be apparent from the above, if only the read-inhibiting control signal 117 is brought to the predetermined high voltage for writing so that the EPROM cell 101 in only the EPROM read-inhibiting circuit 54A, . . . connected to one input of each Y selector 56, . . . is previously written, the reading of only the EPROM cells connected to the digit line 109 connected to one input of each Y selector 56 is inhibited. If only the read-inhibiting control signal 117B is brought to the predetermined high voltage for writing so that the EPROM cell 101 in only the EPROM read-inhibiting circuit 54B, . . . connected to the other input of each Y selector 56, . . . is previously written, the reading of only the EPROM cells connected to the digit line 110 connected to the other input of each Y selector 56 is inhibited. If both of the read-inhibiting control signals 117 and 117B are brought to the predetermined high voltage for writing, all the EPROM cells 101 are previously written, and therefore, the reading of all the EPROM cells in the EPROM is inhibited.

EMBODIMENT 2

Figure 4:
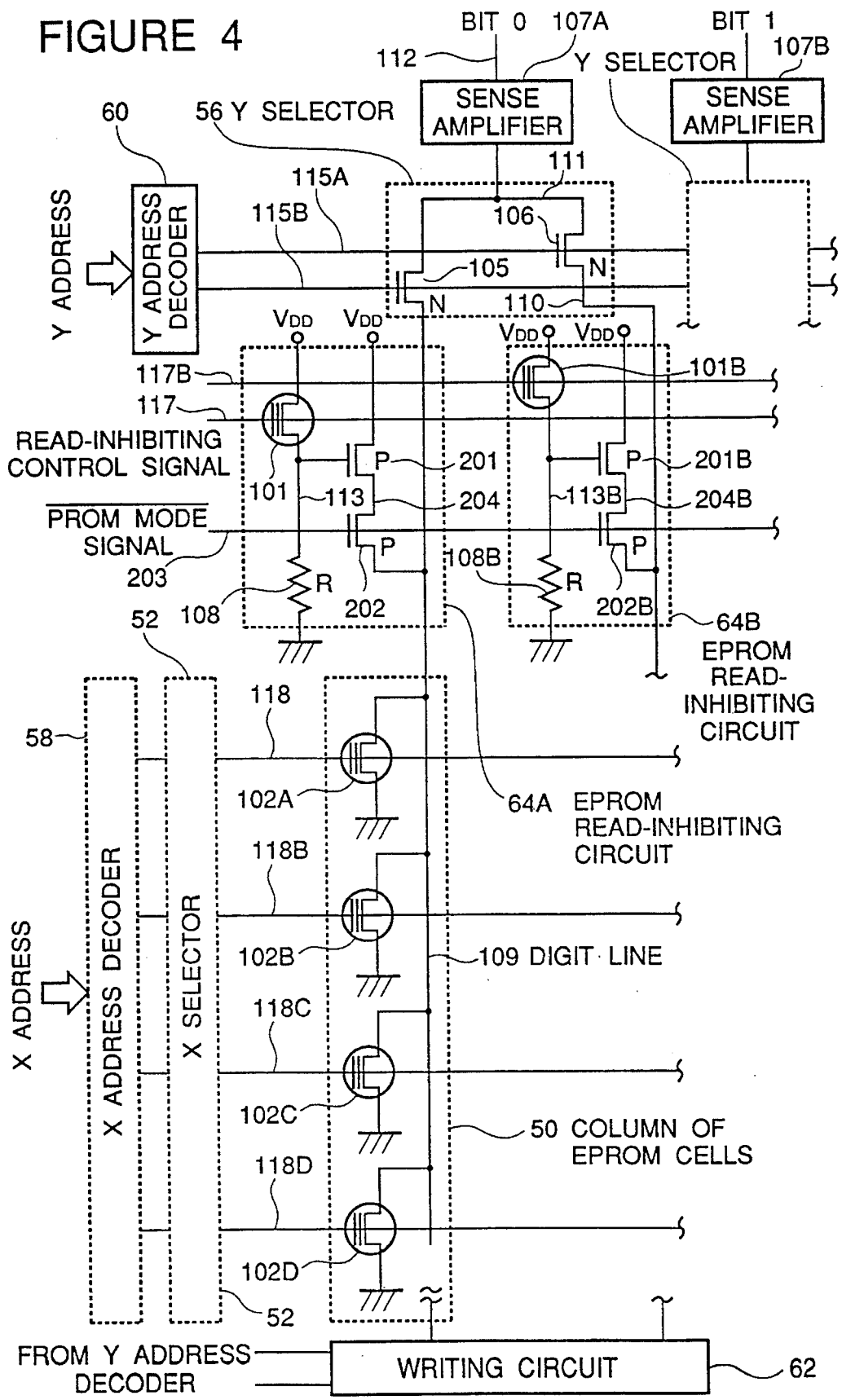
FIG. 4 is a circuit diagram illustrating a second embodiment of the EPROM memory protection circuit in accordance with the present invention.

Next, a second embodiment of the present invention will be explained with reference to FIG. 4. In FIG. 4, a circuit structure is the same as the first embodiment shown in FIG. 3 except for an EPROM read-inhibiting circuit. Therefore, elements corresponding to those shown in FIG. 3 are given the same Reference Numerals, and explanation thereof will be omitted, so that only a structure and operation of the EPROM read-inhibiting circuit will be explained in the following:

An EPROM read-inhibiting circuit 64A (and 64B) of the EPROM memory protection circuit of the second embodiment receives a read-inhibiting control signal 117 brought to the logical high level "H" in the PROM mode, and includes an EPROM cell 101 having a source connected to a high voltage supply voltage $V_{DD}$ and a gate connected to receive the read-inhibiting control signal 117 so that the EPROM cell 101 is written when the read-inhibiting control signal 117 is at a high voltage, a resistor 108 having its one end connected to ground and its other end connected to a drain 113 of the EPROM cell 101. The EPROM read-inhibiting circuit 64A also includes a P-channel MOS transistor 201 having a source connected to the high voltage supply voltage $V_{DD}$ and a gate connected to the drain 113 of the EPROM cell 101, and another P-channel MOS transistor 202 having a source connected to a drain 204 of the P-channel MOS transistor 201 and a gate connected to receive an inverted signal 203 of the PROM mode signal (called an "inverted PROM mode signal" hereinafter).

Now, operation of the EPROM read-inhibiting circuit 64A will be explained.

1. In the case where the reading of the EPPROM is inhibited in the PROM mode.

The read-inhibiting control signal 117 is brought to a predetermined high voltage level for the writing, so as to write the EPROM cell 101. When the EPROM cell 101 is written, a threshold voltage Vth of the EPROM cell 101 rises up, and the EPROM cell 101 is maintained in an OFF condition even if the read-inhibiting control signal is brought to the logical high level "H".

Therefore, the voltage level of the drain 113 of the EPROM cell 101 is brought to the logical low level "L", because it is pulled down to the ground level through the resistor 108.

Since the gate input of P-channel MOS transistor 201 is brought to the logical low level "L", the P-channel MOS transistor 201 turns ON, and therefore, the drain 204 of the P-channel MOS transistor 201 is brought to the same voltage level as that of the source of the P-channel MOS transistor 201, namely, to the logical high level "H".

The inverted PROM mode signal 203 is brought to the logical low level "L" in the PROM mode. Accordingly, since the gate input of the P-channel MOS transistor 202 is brought to the logical low level "L", the P-channel MOS transistor 202 turns ON, and therefore, the voltage level of the drain of the P-channel MOS transistor 202 is brought to the same logical high level "H" as the source of the P-channel MOS transistor 202.

Thus, the level of the digit line 109, to which the drain of the P-channel MOS transistor 202 is connected, becomes fixed to the logical high level "H". Accordingly, the voltage level of the digit line 109 is fixed to the logical high level "H" regardless of whether the drain level of the EPROM cell (102A, 102B, 102C, 102D, . . . ) selected by the X selector is at the logical low level "L" or in the high impedance state.

The voltage level "H" of the digit line 109 is applied through the Y selector 56 to the sense amplifier 107A, where it is discriminated to be the logical high level "H", and then is outputted as the output signal 112 for the bit "BIT 0". Therefore, even if the reading is conducted for a group of the EPROM cells (one column of EPROM cells 50) connected to the digit line 109, the output signal 112 is always at the logical high level "H". Namely, the reading of the group of EPROM cells 50 connected to the digit line 109 is inhibited.

2. In the case where the reading of the EPROM is permitted in the PROM mode.

The writing to the EPROM cell 101 is not conducted. If the writing to the EPROM cell 101 is not conducted, the EPROM cell 101 turns ON when the read-inhibiting control signal 117 is brought to the logical high level "H". For this reason, the level of the drain 113 of the EPROM cell 101 is brought to the logical high level "H", since it is pulled up to the high voltage supply voltage $V_{DD}$.

Since the gate input of the channel MOS transistor 201 is brought to the logical high level "H", the P-channel MOS transistor 201 turns OFF. Therefore, the drain 204 of the P-channel MOS transistor 201 is brought into the high impedance condition. As a result, since the source of the P-channel MOS transistor 202 is brought to a high impedance, the drain of the P-channel MOS transistor 202 is also brought to the high impedance state although the inverted PROM signal 203 is brought to the logical low level "L".

Accordingly, the voltage level of the drain of the EPROM cell (102A, 102B, 102C, 102D, . . . ) selected by the X selector becomes the level of the digit line 109. This level is outputted as the output signal 112 of the sense amplifier 107A in the same manner as that mentioned under the Item "2. In the case there the reading of the EPROM is permitted in the PROM mode" in the first embodiment.

3. In the case where the EPROM is read out in a normal operation.

In the following, explanation is given on the case where the EPROM memory protection circuit in accordance with the present invention is operated in a normal operation, namely in a mode other than the PROM mode.

In the case other than the PROM mode, the gate of the P-channel MOS transistor 202 is brought to the logical high level "H", and accordingly, the P-channel MOS transistor 202 turns OFF, so that the drain of the P-channel MOS transistor 202 is brought into the high impedance condition. A further explanation will be omitted since the succeeding operation is the same as that mentioned under the Item "3. In the case where the EPROM is read out in a normal operation" of the above mentioned first embodiment.

As described above, in the first and second embodiments of the present invention, it is possible to set the reading-inhibition/permission for each group of two groups of digit lines, and therefore to exclusively inhibit the reading of a selected bit or bits of the EPROM output. In this connection, if each EPROM read-inhibiting circuit is controlled by a different mad-inhibiting control signal, it is also possible to set the reading-inhibition/permission for each digit line. Accordingly, it is possible to exclusively inhibit the reading of specific bits in accordance with the user's demand, differently from the conventional read-inhibiting circuits which were capable only of inhibiting the reading of all the bits, namely the whole area of the EPROM. In addition, by inhibiting the reading of only specific bits in an area demanded by the user, unauthorized persons cannot know which bits of which area are inhibited from being read out. This makes it possible to cause a confusion in analysis of the read-out data, which further elevates a security effect.

In the above mentioned embodiments, the explanation was given on the EPROM of the FAMOS structure in which an electric charge is injected into a drain junction by action of an avalanche breakdown caused by applying a high voltage to the drain junction. However, the present invention is also applicable to the EPROM in which an electric charge is injected not by the avalanche breakdown but by a tunnel effect. In addition, the present invention can be also applied to a UV-EPROM (Ultraviolet EPROM), EEPROM (Electrically EPROM) that can be erased by applying a high voltage, and a flash type PROM.

The invention has thus been shown and described with reference to the specific embodiments. However, it should be noted that the present invention is in no way limited to the details of the illustrated structures but changes and modifications may be made within the scope of the appended claims.

As explained above, according to the present invention, the EPROM read-inhibiting circuit is added to the digit line connected to each input of the Y selector so that, when the reading of the EPROM should be inhibited in the PROM mode, the reading from the external is inhibited by fixing the digit line at the logical high level "H" (or the logical low level "L") by means of the EPROM read-inhibiting circuit.

In this way, the present invention makes it possible to set reading-inhibition/permission for each digit line, as well as to inhibit the reading of only a specified bit or bits of the EPROM output. Accordingly, it is possible to exclusively inhibit the reading of specific bits in accordance with the user's demand, differently from the conventional read-inhibiting circuits which were capable only of inhibiting the reading of all the bits, namely the whole area of the EPROM.

In addition, according to the present invention, by inhibiting the reading of only specific bits in an area demanded by the user, unauthorized persons cannot know which bits of which area are inhibited from being read out. This makes it possible to confuse the unauthorized persons, which further elevater a security effect.

And according to the present invention, since the EPROM read-inhibiting circuit is provided within a group of EPROM cells, it is not necessary to add a circuit composed of EPPROM cells outside the EPROM. This is advantageous since the EPROM read-inhibiting circuit can be realized in a small circuit and with a small area.

In addition, according to the present invention, it is possible to additionally set the area for which the reading is to be inhibited, so that it is advantageously possible to realize various EPROM read inhibitions.

I claim:

1. An erasable programmable read-only memory (EPROM) having therein a memory protection circuit, the EPROM comprising:

a plurality of EPROM cells arranged in a matrix having a plurality of rows and a plurality of columns, a plurality of digit lines each connected in common to drains of the EPROM cells included in a corresponding one column of EPROM cells, an X selector for receiving an X address of an address provided from an external and for selecting one row of EPROM cells from the plurality of rows of EPROM cells, a Y selector for receiving a Y address of said address provided from said external and for selecting one digit line of said digit lines, a sense amplifier, receiving an output of said Y selector, for discriminating a potential on said output of said Y selector so as to output a read-out bit signal, and a plurality of reading-inhibition circuits each connected to a corresponding digit line of said digit lines and each having a reading-inhibition information storing EPROM cell, so that when said reading-inhibition information storing EPROM cell of a selected reading-inhibition circuit of said reading-inhibition circuits is in a written condition, said digit line is forcibly maintained at a predetermined logic level, whereby only the content of said EPROM cells connected to the digit line connected to said selected reading-inhibition circuit becomes unreadable through the digit line.

2. An EPROM claimed in claim 1, wherein said EPROM cells of said EPROM and said reading-inhibition information storing EPROM cells comprise a floating gate avalanche injection metal-oxide-semiconductor (FAMOS) structure.

3. An EPROM claimed in claim 1, wherein when said reading-inhibition information storing EPROM cells are in a written condition, said digit lines are forcibly fixed either to a logical low level "L" level or to a logical high level "H".

4. An erasable programmable read-only memory (EPROM) having therein a memory protection circuit, the EPROM comprising:

a plurality of EPROM cells arranged in a matrix having a plurality of rows and a plurality of columns, a plurality of digit lines each connected in common to drains of the EPROM cells included in a corresponding one column of EPROM cells, an X selector for receiving an X address of an address provided from an external and for selecting one row of EPROM cells from the plurality of rows of EPROM cells, a Y selector for receiving a Y address of said address provided from said external and for selecting one digit line of said digit lines, a sense amplifier, receiving an output of said Y selector, for discriminating a potential on said output of said Y selector so as to output a read-out bit signal, and a plurality of reading-inhibition circuits each connected to a corresponding digit line of said digit lines and each having a reading-inhibition information storing EPROM cell, so that when said reading-inhibition information storing EPROM cell of a selected reading-inhibition circuit of said reading-inhibition circuits is in a written condition, said digit line is forcibly maintained at a predetermined logic level, wherein each of said read-inhibition circuits includes:
  the reading-inhibition information storing EPROM cell having a gate connected to receive a read-inhibiting control signal, and a source connected to ground so that said reading-inhibition information storing EPROM cell is written when said read-inhibiting control signal is at a high voltage,
  a resistor having a first end connected to a high voltage supply voltage and a second end connected to a drain of said reading-inhibition information storing EPROM cell,
  a first N-channel metal-oxide semiconductor (MOS) transistor having a grounded source and a gate connected to said drain of said reading-inhibition information storing EPROM cell, and
  a second N-channel MOS transistor having a source connected to a drain of said first N-channel MOS transistor and a gate connected to receive a control signal activated in a programmable read-only memory (PROM) mode,
  a drain of said second N-channel MOS transistor being connected to the corresponding digit line.

5. An erasable programmable read-only memory (EPROM) having therein a memory protection circuit, the EPROM comprising:

a plurality of EPROM cells arranged in a matrix having a plurality of rows and a plurality of columns, a plurality of digit lines each connected in common to drains of the EPROM cells included in a corresponding one column of EPROM cells, an X selector for receiving an X address of an address provided from an external and for selecting one row of EPROM cells from the plurality of rows of EPROM cells, a Y selector for receiving a Y address of said address provided from said external and for selecting one digit line of said digit lines, a sense amplifier, receiving an output of said Y selector, for discriminating a potential on said output of said Y selector so as to output a read-out bit signal, and a plurality of reading-inhibition circuits each connected to a corresponding digit line of said digit lines and each having a reading-inhibition information storing EPROM cell, so that when said reading-inhibition information storing EPROM cell of said selected reading-inhibition circuit of said reading-inhibition circuits is in a written condition, said digit line is forcibly maintained at a predetermined logic level, wherein each of said read-inhibiting circuits includes:
  the reading-inhibition information storing EPROM cell having a gate connected to receive a read-inhibiting control signal and a source connected to a high voltage supply voltage so that said reading-inhibition information storing EPROM cell is written when said read-inhibiting control signal is at a high voltage,
  a resistor having a first end connected to ground and a second end connected to a drain of said EPROM cell,
  a first P-channel MOS transistor having a source connected to said high voltage supply voltage and a gate connected to said drain of said reading-inhibition information storing EPROM cell, and
  a second P-channel MOS transistor having a source connected to a drain of said first P-channel MOS transistor and a gate input connected to receive a control signal brought to a logical low level "L" in a programmable read-only memory (PROM) mode,
  a drain of second P-channel MOS transistor being connected to the corresponding digit line.

6. An EPROM claimed in claim 2, wherein when said reading-inhibition information storing EPROM cells are in a written condition, said digit lines are forcibly fixed either to a logical low level "L" level or to a logical high level "H".

7. An EPROM claimed in claim 1, wherein each of said read-inhibition circuits includes:
  the reading-inhibition information storing EPROM cell having a gate connected to receive a read-inhibiting control signal, and a source connected to ground so that said reading-inhibition information storing EPROM cell is written when said read-inhibiting control signal is at a predetermined voltage.

8. An EPROM claimed in claim 1, wherein each of said read-inhibition circuits includes:
  a resistor having a first end connected to a predetermined voltage supply voltage and a second end connected to a drain of said reading-inhibition information storing EPROM cell.

9. An EPROM claimed in claim 8, wherein each of said read-inhibition circuits further includes:
  a first metal-oxide semiconductor (MOS) transistor having a grounded source and a gate connected to said drain of said reading-inhibition information storing EPROM cell.

10. An EPROM claimed in claim 9, wherein each of said read-inhibition circuits further includes:
  a second MOS transistor having a source connected to a drain of said first MOS transistor and a gate connected to receive a control signal activated in a programmable read-only memory (PROM) mode, a drain of said second MOS transistor being connected to the corresponding digit line.

11. An EPROM claimed in claim 9, wherein said first MOS transistor comprises a first N-channel transistor.

12. An EPROM claimed in claim 10, wherein said second MOS transistor comprises a second N-channel transistor.

13. An EPROM claimed in claim 1, wherein each of said read-inhibition circuits includes:

the reading-inhibition information storing EPROM cell having a gate connected to receive a read-inhibiting control signal and a source connected to a predetermined voltage supply voltage so that said reading-inhibition information storing EPROM cell is written when said read-inhibiting control signal is at a predetermined voltage.

14. An EPROM claimed in claim 13, wherein each of said read-inhibiting circuits further includes:

a resistor having a first end connected to ground and a second end connected to a drain of said EPROM cell.

15. An EPROM claimed in claim 14, wherein each of said read-inhibiting circuits further includes:

a first MOS transistor having a source connected to said predetermined voltage supply voltage and a gate connected to said drain of said reading-inhibition information storing EPROM cell.

16. An EPROM claimed in claim 15, wherein each of said read-inhibiting circuits further includes:

a second MOS transistor having a source connected to a drain of said first MOS transistor and a gate input connected to receive a control signal brought to a logical low level "L" in a programmable read-only memory (PROM) mode, a drain of second P-channel MOS transistor being connected to the corresponding digit line.

17. An EPROM claimed in claim 15, wherein said first MOS transistor comprises a first P-channel transistor.

18. An EPROM claimed in claim 16, wherein said second MOS transistor comprises a second P-channel transistor.

19. An EPROM claimed in claim 1, wherein each of said read-inhibition circuits are selectively controllable by different read-inhibiting control signals.

20. An EPROM claimed in claim 1, wherein each of said read-inhibition circuits are controllable by a same PROM mode signal and wherein a reading of specific bits of the content of said EPROM cells is selectively inhibited.

* * * * *

UNITED STATES PATENT AND TRADEMARK OFFICE
CERTIFICATE OF CORRECTION

PATENT NO. : 5,506,806
DATED : April 9, 1996
INVENTOR(S) : Fukushima

It is certified that error appears in the above-indentified patent and that said Letters Patent is hereby corrected as shown below:

Title page, col. 2, line 3, add--U.S. Patent No. 4,744,062
Japanese Patent No. 62-236053
Japanese Patent No. 50-20204

Signed and Sealed this

Thirtieth Day of July, 1996

BRUCE LEHMAN

Attest:

*Attesting Officer*    *Commissioner of Patents and Trademarks*